United States Patent
Schwab et al.

(10) Patent No.: US 11,680,976 B2
(45) Date of Patent: Jun. 20, 2023

(54) METHOD FOR CHECKING A CAPACITY OF A SUPPLY LINE

(71) Applicant: Robert Bosch GmbH, Stuttgart (DE)

(72) Inventors: Christian Schwab, Sternenfels (DE); Helmut Suelzle, Pleidelsheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 441 days.

(21) Appl. No.: 16/909,547

(22) Filed: Jun. 23, 2020

(65) Prior Publication Data
US 2021/0033657 A1   Feb. 4, 2021

(30) Foreign Application Priority Data
Jul. 30, 2019  (DE) .......................... 102019211384.2

(51) Int. Cl.
*G01R 31/00* (2006.01)
*B60T 17/22* (2006.01)

(52) U.S. Cl.
CPC .......... *G01R 31/006* (2013.01); *B60T 17/221* (2013.01); *B60T 2270/403* (2013.01)

(58) Field of Classification Search
CPC ................. G01R 31/006; B60T 17/221; B60T 2270/0403
See application file for complete search history.

(56) References Cited

U.S. PATENT DOCUMENTS

| 6,661,231 B1* | 12/2003 | Arai ..................... G01R 31/374 324/426 |
| 2011/0172839 A1* | 7/2011 | Brown ................... B60L 53/16 700/286 |

* cited by examiner

*Primary Examiner* — Calvin Cheung
(74) *Attorney, Agent, or Firm* — Norton Rose Fulbright US LLP; Gerard Messina

(57) ABSTRACT

A method for checking a capacity of at least one supply line for an electrically operated assembly that is coupled electrically via the at least one supply line to an electrical system of an at least partially automated mobile platform. The method includes: ensuring a non-critical operating state of the mobile platform; determining an off-load terminal voltage at an input connection of the assembly, with zero-current supply line; applying a defined current to the supply line of the electrically operated assembly; determining an on-load terminal voltage at the input connection of the assembly, in doing so, the defined voltage being applied to the supply line of the electrically operated assembly; determining a differential voltage between the off-load terminal voltage and the on-load terminal voltage; comparing the differential voltage to a differential-voltage limit value to determine whether the capacity of the electric supply line is sufficient to operate the assembly.

13 Claims, 2 Drawing Sheets

METHOD FOR CHECKING A CAPACITY OF A SUPPLY LINE

CROSS REFERENCE

The present application claims the benefit under 35 U.S.C. § 119 of German Patent Application No. DE 102019211384.2 filed on Jul. 30, 2019, which is expressly incorporated herein by reference in its entirety.

FIELD

The present invention relates to a method for checking a capacity of a supply line for an electrically operated assembly of a mobile platform.

BACKGROUND INFORMATION

Automated functionalities of at least partially automated vehicles which are allowed presently for road traffic require the presence and control of a driver. In the case of at least partially automated functionalities of a vehicle, without a driver in the vehicle who is at least monitoring, the intervention of a driver is eliminated as functional fallback system.

On the other hand, in the case of fully automated parking of a vehicle without the presence of a driver in the vehicle, for example, it must be ensured that the vehicle, and here especially the brake system, is always capable of bringing the vehicle safely to a halt and holding it.

SUMMARY

The current park-assist functionalities of vehicles require the presence of the driver and his/her active intervention in the parking process by operation of the brake pedal. This system with the driver has a redundant design, in that the service brake has a first functionality with braking assistance, and in the event this first functionality of the service brake fails, provides a second functionality which, without braking assistance and based on a hydraulic system, enables the driver, without braking assistance, to bring the vehicle to a halt, even without braking assistance.

Consequently, the need for additional automated redundancies in the brake system or special availability demands on the components of the brake system do not arise for present park-assist functionalities.

In the case of fully automated parking of the vehicle, in which the presence of a driver in the vehicle is not needed, the driver is eliminated as fallback system. For reliable and safe functioning, such a vehicle, especially the brake system of the vehicle, must have an additional automated fallback system, e.g., for the brake system. With that, the brake system is then able to bring the vehicle to a halt independently, even in the event a part of the redundantly designed brake system fails.

For example, an additional automated fallback system may be provided by using the electric parking brake (EPB/or APB: automatic parking brake) as fallback system for the service brake. Moreover, given suitable design and at low speeds, the locking pawl of the automatic transmission may be used as second fallback system.

In order for assemblies such as the brake system and the indicated fallback systems to be able to operate safely and reliably, an especially high demand in terms of availability must be placed on the electrical system of such a vehicle, since both the service brake and the parking brake are operated electrically.

An electrical system of vehicles has electrical resistances attributable to electric lines or contacts, for example.

When a current flows through such resistances, the voltage drops across the resistances and the terminal voltage available to a consumer or load falls. The voltage drop at these resistances also increases with the level of the current through these resistances. Because of the required power and the relatively low voltage in a vehicle electric system, very high currents flow, so that this effect becomes essential for the functioning of connected electrical loads such as electrical assemblies, for example.

The resistance of such a supply line is understood here to the effect that all resistances which are able to influence the terminal voltage at the end of the supply line at which a load is connected are combined in one value. Thus, this includes contact resistances and ground connections, as well.

If a voltage available at the terminal connectors of such assemblies is too low because of the drop in voltage over at least parts of the supply line, it may be that all functions of the assemblies can no longer be maintained if a voltage drop thus falls below a shutoff threshold of the assembly. Otherwise, a resultant performance capability of the assemblies may be limited because of the lower voltage.

The measurement of the voltage of the vehicle electrical system alone is not sufficient to predict the capacity of the electrical energy supply, particularly due to resistances in a supply line.

According to one aspect of the present invention, a method for checking a capacity of at least one supply line for an electrically operated assembly, a device, a computer program and a machine-readable storage medium are provided. Advantageous refinements of the present invention are described herein.

According to one aspect of the present invention, an example method is provided for checking a capacity of at least one supply line for an electrically operated assembly that is coupled electrically via the at least one supply line to an electrical system of an at least partially automated mobile platform. In one step of the method, a non-critical operating state of the mobile platform is ensured.

In a further step, an off-load terminal voltage is determined at an input connection of the assembly, with zero-current supply line. In another step, a defined current is applied to the supply line of the electrically operated assembly. In a further step, an on-load terminal voltage is determined at the input connection of the assembly, in doing so, the defined current being applied to the supply line of the electrically operated assembly. In another step, a differential voltage is determined between the off-load terminal voltage and the on-load terminal voltage.

In a further step, the differential voltage is compared to a differential-voltage limit value in order to determine whether the capacity of the electric supply line is sufficient to operate the assembly.

In this entire description of the present invention, the sequence of method steps is presented so that the method is easily comprehensible. However, one skilled in the art will recognize that many of the method steps may also be run through in a different sequence and lead to the same or an equivalent result. With this in mind, the sequence of the method steps may be changed accordingly.

A mobile platform may be understood to be an at least partially automated system which is mobile, and/or a driver-assistance system of a vehicle. An example may be an at least partially automated vehicle or a vehicle having a driver-assistance system. In other words, in this context, an at least partially automated system includes a mobile platform as regards an at least partially automated functionality, but a mobile platform also includes vehicles and other mobile machines including driver-assistance systems. Further examples for mobile platforms may be driver-assistance systems having a plurality of sensors, mobile multi-sensor robots such as robotic vacuum cleaners or lawn mowers, a multi-sensor monitoring system, a manufacturing machine, a personal assistant or an access control system. Each of these systems may be a completely or partially automated system.

In this context, a non-critical operating state of a mobile platform is a state in which no active danger emanates from the mobile platform and the mobile platform is also not acutely endangered passively. For example, this may be the case when such a mobile platform stops in a parking position or holding position permissible under traffic law.

With the example method, it is possible to test a capacity of at least one supply line of an assembly whose safe and reliable functionality is essential for a planned maneuver of the mobile platform, or a secondary assembly may be tested which is provided as a fallback system in case of a defect in the assembly.

Using the example method, a capacity of at least one supply line of the vehicle electrical system may be checked for sufficient capacity for an important assembly prior to the beginning of a fully automated parking process. This significantly reduces the risk that incidents will occur during the fully automated parking process due to a poor energy supply to the assembly electrically coupled to this supply line.

According to one aspect of the present invention, the current is applied with the aid of the assembly, and the assembly is driven in a test mode with pulsed currents without causing an outward mechanical effect.

With the aid of such a test mode in which the assembly is driven with pulsed currents, a very precisely defined current may be applied to the supply line. This then offers the advantage of being able to judge the behavior of the electrical system in an even more defined manner.

According to one aspect of the present invention, the assembly is a service brake of the mobile platform, and the defined current is applied to the supply line of the electrically operated service brake by operating the service brake with activation of a braking functionality of the mobile platform.

As a result, first of all, the capacity of the supply line is able to be checked, and in addition, the activation of the braking functionality may initiate a subsequent maneuver. In particular, a supply line may thus be checked with the aid of an electromechanical brake unit.

By measuring the on-load terminal voltage during a defined brake actuation, a simple instrument is obtained for reducing the risk of an impermissible undervoltage. The test is able to be integrated into the procedure of the autonomous parking maneuver without additional process steps and is carried out at a point in time at which the maneuver has not yet begun. Unsafe states may thus effectively be avoided.

According to one aspect of the present invention, the assembly is a service brake of the mobile platform, and the defined current is applied to the supply line of the electrically operated service brake by operating the service brake in order to build up pressure in the brake hydraulics of the mobile platform.

As a result, first of all, the capacity of the supply line is able to be checked, and in addition, owing to the buildup of pressure in the brake hydraulics, a subsequent maneuver is able to be initiated. In particular, a supply line may thus be checked with the aid of a hydraulic brake unit.

By measuring a drop in voltage or a differential voltage during a defined brake actuation, a simple instrument is obtained for reducing the risk of an impermissible undervoltage for an assembly such as the service brake. Such a test is able to be integrated into the procedure of the fully automated parking maneuver without additional maneuver steps and is carried out at a point in time at which the maneuver has not yet begun. Unsafe states may thus effectively be avoided.

According to a further aspect of the present invention, the check is carried out prior to a planned maneuver of the at least partially automated platform, and the non-critical state of the mobile platform is ensured with the aid of an electrically activated parking brake of the mobile platform.

Owing to the system of the electrically activated parking brake, which is independent of the service brake, it is possible to ensure that in the event of a malfunction of the service brake, which was discovered during the check of the capacity of the supply line, the mobile platform continues to be retained in a non-critical operating state.

If the vehicle electrical system is checked for sufficient capacity, particularly as regards a supply line of an electrically operated assembly such as a brake system, prior to the beginning of a fully automatic parking process, the risk that events will occur during the fully automatic parking process due to a poor energy supply is reduced significantly.

According to a further aspect of the present invention, the check is carried out prior to a planned maneuver of the at least partially automated platform, and the non-critical state of the mobile platform is ensured with the aid of an electrically activated locking pawl of an automatic transmission of the mobile platform.

The electrically activated locking pawl of an automatic transmission represents a further possibility, in addition to the electrically activated parking brake, for ensuring a non-critical state of the mobile platform.

According to one aspect of the present invention, the planned maneuver is aborted by not deactivating the activated parking brake or, correspondingly, the activated locking pawl, if the capacity of the electric supply line has been determined to be insufficient for operation of the assembly.

As a result, if the check has determined that the capacity of the supply line of the service brake is not sufficient, the mobile platform continues to be retained in a safe or non-critical operating state.

According to one aspect of the present invention, the electric parking brake or the locking pawl of the automatic transmission is released if the test has determined that the capacity of the electric supply line is sufficient for the operation of the service brake, and the service brake has built up a defined pressure in the brake hydraulics or the activation of a braking functionality was successful.

The successful check of the capacity of the supply line for the service brake guarantees the goal of ensuring a safe state for implementing an automatic functionality prior to the execution of a maneuver, so that a successful execution of the maneuver may be assumed.

In accordance with the present invention, a method is provided in which, based on the comparison of the differential voltage to the differential-voltage limit value, a control signal is provided for controlling an at least partially automated vehicle; and/or based on the comparison of the differential voltage to the differential-voltage limit value, a warning signal is made available to warn a vehicle occupant.

The term "based on" in connection with the feature that a control signal or a warning signal is provided based on the comparison of the differential voltage to the differential-voltage limit value is to be understood broadly. It is to be understood to the effect that although the comparison of the differential voltage to the differential-voltage limit value is utilized for any determination or calculation of a control signal or a warning signal, this does not rule out that other input variables are also utilized for this determination of the control signal or the warning signal.

The result of the check of a capacity of a supply line for an electrically operated assembly, which in particular is a service brake, may thus be used for the control of the mobile platform and/or the result of an unsuccessful check may go out as a warning signal to a driver or another vehicle occupant, for example.

According to one aspect of the present invention, a device is indicated which is equipped to carry out one of the methods described above. With such a device, the corresponding method may easily be integrated into different systems.

According to a further aspect of the present invention, a computer program is indicated which includes commands that, upon execution of the computer program by a computer, cause it to carry out one of the methods described above. Such a computer program permits use of the described method in different systems.

According to the present invention, a machine-readable storage medium is also, on which the computer program described above is stored.

BRIEF DESCRIPTION OF THE DRAWINGS

Exemplary embodiments of the present invention are represented with reference to the figures and are explained in greater detail below.

DETAILED DESCRIPTION OF EXAMPLE EMBODIMENTS

Figure 1:
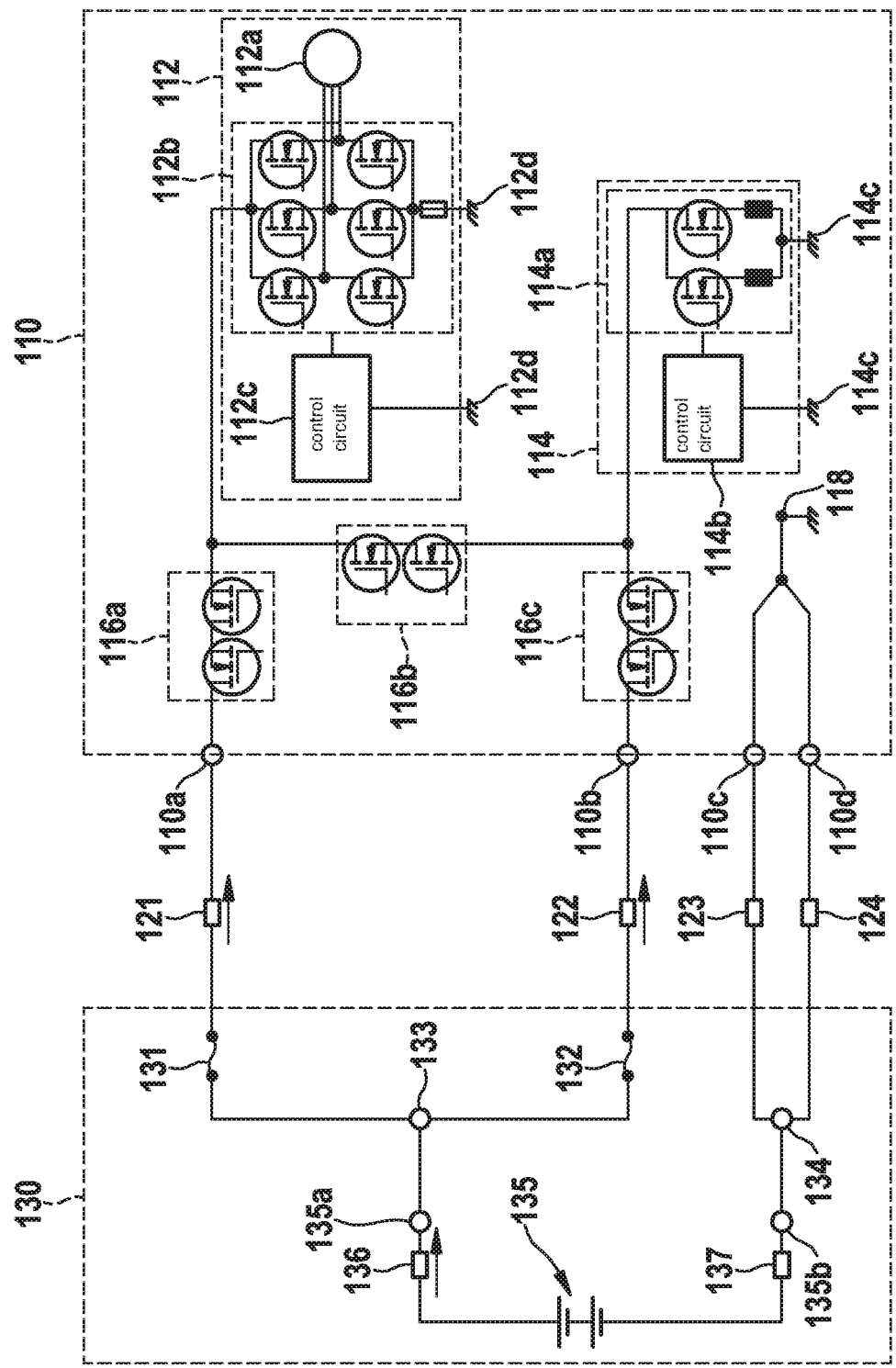
FIG. 1 shows an example vehicle electrical system with a supply line and an assembly.

The method for checking a capacity of at least one supply line 121, 122 for an electrically operated assembly 110, which is electrically coupled via the at least one supply line 121, 122 to an electrical system 130 of an at least partially automated mobile platform, is described with reference to FIG. 1 and FIG. 2.

In a first part of the description of one exemplary embodiment, the method itself is described, and in a second part of the description of the exemplary embodiment, details of the electronic wiring of the exemplary embodiment to an assembly of a brake system are described.

This check of the capacity of at least one supply line 121, 122 may be carried out during an initialization phase of a fully automated parking.

In a step S1, a non-critical operating state of the mobile platform is ensured. For example, this may be accomplished by actuating the parking function of the electric parking brake.

In a further step S2, an off-load terminal voltage is determined at an input connection 110a of the assembly of a brake system 110, with zero-current supply line 121.

Before the electric parking brake is released prior to beginning the fully automated parking process, the service brake must build up sufficient pressure to secure the vehicle after the parking brake is released. This pressure buildup is carried out in defined fashion.

To that end, in a further step S3, a defined current is applied to supply line 121 of the electrically operated assembly of brake system 110.

For example, this may be accomplished by building up a defined hydraulic pressure in the hydraulic service brake, which represents a load 112. During this pressure buildup, current is drawn from vehicle electrical system 130 by the service brake.

Because of the resistances of supply line 121 described, this leads to a reduction in the terminal voltage at connection 110a of assembly 110.

In a further step S4, the on-load terminal voltage is determined at input connection 110a of assembly 110, in doing so, the defined current, e.g., of the electrohydraulic service brake, being applied to supply line 121 of electrically operated assembly 110. In other words, this means that if assembly 110 is a service brake, the voltage is measured at the terminal connectors of the service brake.

In a further step S5, a differential voltage is determined between the off-load terminal voltage and the on-load terminal voltage by subtraction.

In a further step S6, the differential voltage is compared to a differential-voltage limit value in order to determine whether the capacity of the electric supply line is sufficient to operate the assembly.

With this comparison, it is thus possible to judge whether the vehicle electrical system, with the resistances of the supply line or supply lines 121, 122 and ground cables 123, 124, the contact points and the internal resistance of the energy source, is sufficiently stable for the defined braking maneuver during the parking process.

Put another way, this means that if at defined loading, the terminal voltage drops more sharply than allowed by the differential-voltage limit value, this is an indication of an insufficient electrical system 130, and the parking process is aborted. Since the electric parking brake is still applied at the point in time, the vehicle remains secured in its position.

Figure 2:
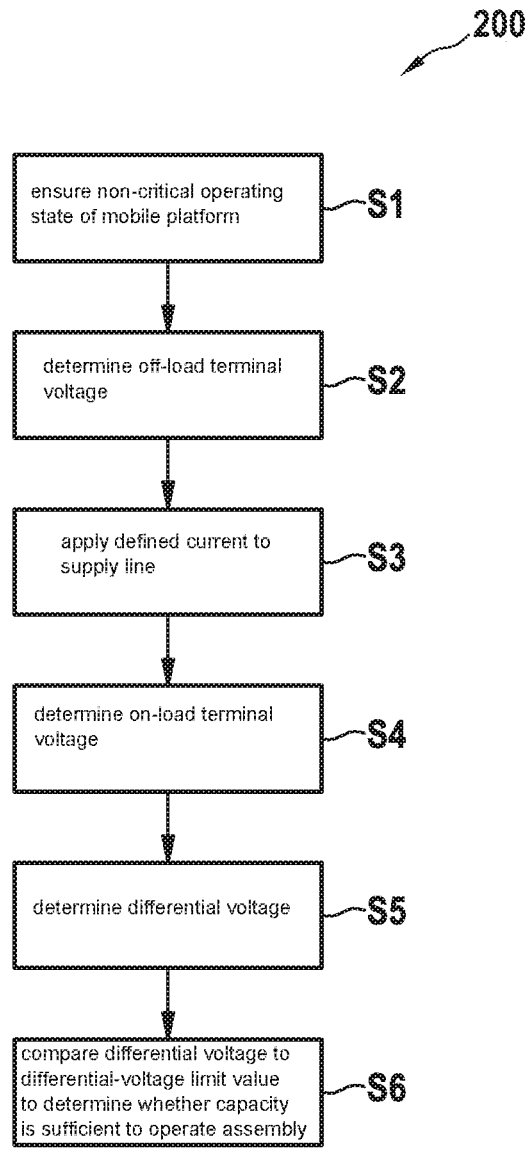
FIG. 2 shows an example method for checking a capacity of at least one supply line.

FIG. 1 shows schematically a vehicle electrical system 130 that is connected via one electroconductive supply line 121 to a first connection 110a of assembly 110 and via a second electroconductive supply line 122 to a second connection 110b of assembly 110, the two supply lines 121, 122 being connected to each other at a neutral point or interconnection 133 on the current-source side within vehicle electrical system 130.

Neutral point 133 is connected with a first connection 135a to current source 135. A second connection 135b of the current source 135 is connected via two parallel-connected grounds 123, 124 to ground connection 118 of assembly 110. At the same time, the two parallel-connected grounds 123, 124 are connected to each other on the current-source side via a ground neutral point 134.

In FIG. 1, the grounding with the two grounds 123, 124 is laid out redundantly. However, this grounding between current source 135 and ground 118 of assembly 110 may also be designed as one line or, e.g., as an electroconductive chassis.

Electrical assembly 110 has a first switch 116a that is disposed between first connection 110a of assembly 110 and a first load 112 in such a way that a conductive interconnect may be produced selectively between first load 112 and first connection 110a of assembly 110.

Electrical assembly 110 has a second switch 116c that is disposed between second connection 110b and further load 114 of assembly 110 in such a way that a conductive interconnect is able to be produced selectively between further load 114 and second connection 110b of assembly 110.

First switch 116a and second switch 116c may be electrically connected to each other selectively with the aid of a third switch 116b that is contacted to first switch 116a and second switch 116c, respectively, on the side opposite connections 110a, 110b. First load 112 of assembly 110 is connected to second contact 135b of current source 135 with the aid of a ground 112d. Further load 114 of assembly 110 is connected to second contact 135b of current source 135 with the aid of a ground 114c. Current source 135 may be described with an ideal current source 135 which is connected via its respective internal resistances 136, 137 with its first connection 135a and its second connection 135b of current source 135.

To determine the on-load terminal voltage of first electric supply line 121 of electrical assembly 110, an electrical interconnect is set up between first supply line 121 and load 112 by closing first switch 116a. An electrical interrupt is set up between second supply line 122 and electrical loads 112, 114 of assembly 110 by opening second switch 116c of assembly 110. With this connection, with the aid of first switch 116a and first load 112 of assembly 110, a current is injected into first supply line 121 by current source 135, since load 112 is also connected via its ground 112d to second pole 135b of current source 135. In the event that first load 112 of assembly 110 does not represent a passive electrical load, for injecting a current into a motor 112a, first load 112 must be driven by a control circuit 112c that is disposed in assembly 110 and controls inverter 112b for the operation of motor 112a.

The method described here may be used analogously to determine the resistance of second supply line 122 by impressing the current of load 112 upon second supply line 122, in doing so, second switch 116c and third switch 116b being closed and first switch 116a being opened. The voltages and currents of second supply line 122 are determined accordingly, in a manner analogous to that described above.

The on-load terminal voltage is determined at input 110a of first supply line 121 of assembly 110, using a voltage sensor or a voltmeter, which is not drawn in in FIG. 1. By connecting first load 112 to current source 135 with the aid of closed first switch 116a, a current is thereby injected into first supply line 121.

For example, the off-load terminal voltage may be determined at input 110b of second supply line 122 of assembly 110, using a voltage sensor or a voltmeter, which is not drawn in in FIG. 1.

The off-load terminal voltage may be determined at input 110b of second supply line 122 of assembly 110 using the voltage sensor described above when no current is being applied to first supply line 121, by opening first switch 116a of assembly 110, for example.

To determine the current, load 112 may have a current sensor or an ammeter which determines the current that is applied to first supply line 121.

What is claimed is:

1. A method for checking a capacity of at least one supply line for an electrically operated assembly that is coupled electrically via the at least one supply line to an electrical system of an at least partially automated mobile platform, comprising the following steps:

ensuring a non-critical operating state of the mobile platform;
determining an off-load terminal voltage at an input connection of the electrically operated assembly, with the supply line currentless;
applying a defined current to the supply line of the electrically operated assembly;
determining an on-load terminal voltage at the input connection of the electrically operated assembly while the defined current is being applied to the supply line of the electrically operated assembly;
determining a differential voltage between the off-load terminal voltage and the on-load terminal voltage; and
comparing the differential voltage to a differential-voltage limit value to determine whether the capacity of the supply line is sufficient to operate the electrically operated assembly.

2. The method as recited in claim 1, wherein the defined current is applied using the electrically operated assembly, and the assembly is driven in a test mode with pulsed currents without causing an outward mechanical effect.

3. The method as recited in claim 1, wherein the electrically operated assembly is a service brake of the mobile platform, and the defined current is applied to the supply line of the electrically operated service brake by operating the service brake with activation of a braking functionality of the mobile platform.

4. The method as recited in claim 1, wherein the electrically operated assembly is a service brake of the mobile platform, and the defined current is applied to the supply line of the electrically operated service brake by operating the service brake in order to build up pressure in the brake hydraulics of the mobile platform.

5. The method as recited in claim 1, wherein the capacity is checked prior to a planned maneuver of the at least partially automated platform, and the non-critical state of the mobile platform is ensured using an electrically activated parking brake of the mobile platform.

6. The method as recited in claim 5, wherein the planned maneuver is aborted by not deactivating the electrically activated parking brake when the capacity of the supply line has been determined to be insufficient for operation of the electrically operated assembly.

7. The method as recited in claim 5, wherein the electrically activated parking brake is released when the check has determined that the capacity of the electric supply line is sufficient to operate the service brake, and the service brake has built up a defined pressure in the brake hydraulics or the activation of a braking functionality was successful.

8. The method as recited in claim 1, wherein the check is carried out prior to a planned maneuver of the at least partially automated mobile platform, and the non-critical state of the mobile platform is ensured using an electrically activated locking pawl of an automatic transmission of the mobile platform.

9. The method as recited in claim 8, wherein the planned maneuver is aborted by not deactivating the electrically activated locking pawl, when the capacity of the electric supply line has been determined to be insufficient for operation of the assembly.

10. The method as recited in claim 8, wherein the electrically activated locking pawl of the automatic transmission is released when the check has determined that the capacity of the electric supply line is sufficient to operate the service brake, and the service brake has built up a defined pressure in the brake hydraulics or the activation of a braking functionality was successful.

11. The method as recited in claim 1, wherein: (i) based on the comparison of the differential voltage to the differential-voltage limit value, a control signal is provided for controlling the at least partially automated vehicle, and/or (ii) based on the comparison of the differential voltage to the differential-voltage limit value, a warning signal is made available to warn a vehicle occupant.

12. A device configured to check a capacity of at least one supply line for an electrically operated assembly that is coupled electrically via the at least one supply line to an electrical system of an at least partially automated mobile platform, the device configured to:
- ensure a non-critical operating state of the mobile platform;
- determine an off-load terminal voltage at an input connection of the electrically operated assembly, with the supply line currentless;
- apply a defined current to the supply line of the electrically operated assembly;
- determine an on-load terminal voltage at the input connection of the electrically operated assembly while the defined current is being applied to the supply line of the electrically operated assembly;
- determine a differential voltage between the off-load terminal voltage and the on-load terminal voltage; and
- compare the differential voltage to a differential-voltage limit value to determine whether the capacity of the supply line is sufficient to operate the electrically operated assembly.

13. A non-transitory machine-readable storage medium on which is stored a computer program for checking a capacity of at least one supply line for an electrically operated assembly that is coupled electrically via the at least one supply line to an electrical system of an at least partially automated mobile platform, the computer program, when executed by a computer, causing the computer to perform the following steps:
- ensuring a non-critical operating state of the mobile platform;
- determining an off-load terminal voltage at an input connection of the electrically operated assembly, with the supply line currentless;
- applying a defined current to the supply line of the electrically operated assembly;
- determining an on-load terminal voltage at the input connection of the electrically operated assembly while the defined current is being applied to the supply line of the electrically operated assembly;
- determining a differential voltage between the off-load terminal voltage and the on-load terminal voltage; and
- comparing the differential voltage to a differential-voltage limit value to determine whether the capacity of the supply line is sufficient to operate the electrically operated assembly.

* * * * *